US009508196B2

(12) United States Patent
Chen et al.

(10) Patent No.: US 9,508,196 B2
(45) Date of Patent: Nov. 29, 2016

(54) COMPACT SCALABLE THREE DIMENSIONAL MODEL GENERATION

(71) Applicant: Futurewei Technologies, Inc., Plano, TX (US)

(72) Inventors: Yunxia Chen, Fremont, CA (US); Kenneth Durazzo, San Ramon, CA (US)

(73) Assignee: Futurewei Technologies, Inc., Plano, TX (US)

( * ) Notice: Subject to any disclaimer, the term of this patent is extended or adjusted under 35 U.S.C. 154(b) by 716 days.

(21) Appl. No.: 13/678,065

(22) Filed: Nov. 15, 2012

(65) Prior Publication Data

US 2014/0136153 A1 May 15, 2014

(51) Int. Cl.
*G06F 17/50* (2006.01)
*G06T 19/20* (2011.01)

(52) U.S. Cl.
CPC ............... *G06T 19/20* (2013.01); *G06F 17/50* (2013.01); *G06T 2219/2004* (2013.01)

(58) Field of Classification Search
CPC ........... G06T 19/20; G06T 2219/2004; G06F 17/50; G06F 17/5077; G06F 2217/02; H04L 41/14
USPC ...................... 703/1; 345/419, 584
See application file for complete search history.

(56) References Cited

U.S. PATENT DOCUMENTS 5,255,352 A * 10/1993 Falk .............................. 345/582
5,657,432 A * 8/1997 Matsui .................... G06T 15/04
   345/419
6,363,404 B1 * 3/2002 Dalal et al. .................... 715/201
8,294,705 B2   10/2012 Dillenberger et al.
2003/0117425 A1 * 6/2003 O'Leary et al. .............. 345/700
2006/0087505 A1 * 4/2006 Dumesny et al. ............ 345/419
2006/0120593 A1   6/2006 Oshino
2008/0278478 A1 * 11/2008 Dillenberger et al. ....... 345/419

OTHER PUBLICATIONS

Azariadis, Phillip N. et al., "On Using Planar Developments to Perform Texture Mapping on Arbitrarily Curved Surfaces", 2000, Computer & Graphics 24, Elsevier Science Ltd.*
Bernardini, Fausto et al., "The 3D Model Acquisition Pipeline", 2002, Computer Graphics Forum, vol. 21, No. 2, The Eurographics Association and Blackwell Publishers Ltd.*
Lin, Juncong et al., "Automatic PolyCube-Maps", 2008, Springer-Verlag.*
Marschner, Stephen Robert, Inverse Rendering for Computer Graphics, Aug. 1998, Cornell University.*

* cited by examiner

*Primary Examiner* — Cedric D Johnson
(74) *Attorney, Agent, or Firm* — Conley Rose, P.C.; Grant Rodolph

(57) ABSTRACT

A user equipment (UE) comprising a processor configured to generate a three dimensional (3D) model by obtaining a 3D mesh comprising a plurality of reference markers, positioning at least one first order virtual object onto a surface of the mesh by associating the first order virtual object to at least one of the mesh reference markers, wherein the first order virtual object comprises a plurality of reference markers, and positioning at least one second order virtual object onto a surface of the mesh by associating the second order virtual object to at least one of the first order virtual object reference markers.

18 Claims, 10 Drawing Sheets

COMPACT SCALABLE THREE DIMENSIONAL MODEL GENERATION

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Three dimensional (3D) modeling may allow a user to view a virtual device that appears substantially similar to a physical device that the virtual device represents. Modeling a device with multiple versions may require the creation of a separate model for each version. Modeling a highly modular device may require the creation of a very large number of models to display all possible permutations. Each model of a modular device may be distinct from other models, which may result in the need to store, transmit, and process each model separately. A system may be unsure which versions of a device the user wishes to view prior to run time, which may require that all models be loaded at run time resulting in significant processing delays. Related models may also comprise substantial amounts of redundant data resulting in significant data storage requirements. 3D models of a highly modular device may also be difficult to update as a change must be made to each model individually and may not be automatically propagated to all related models.

SUMMARY

In one embodiment, the disclosure includes a method of generating a 3D graphical model comprising obtaining a 3D mesh comprising a reference marker, wherein the 3D mesh defines a 3D shape of the model, obtaining a first order virtual object that defines a surface appearance of the model, and positioning the first order virtual object onto a surface of the 3D mesh by associating the first order virtual object to the reference marker.

In another embodiment, the disclosure includes a user equipment (UE) comprising a processor configured to generate a 3D model by obtaining a 3D mesh comprising a plurality of reference markers, positioning at least one first order virtual object onto a surface of the mesh by associating the first order virtual object to at least one of the mesh reference markers, wherein the first order virtual object comprises a plurality of reference markers, and positioning at least one second order virtual object onto a surface of the mesh by associating the second order virtual object to at least one of the first order virtual object reference markers.

In another embodiment, the disclosure also includes a network element (NE) comprising a processor configured to store a 3D model as a 3D mesh comprising a plurality of reference markers and a plurality of virtual objects configured to be positioned on a surface of the 3D mesh via at least one of the reference markers, receive a request message from a UE for a 3D model data related to a second network element, and transmit a reply message to the UE, wherein the reply message comprises the 3D mesh, configuration data associated with the second network element, a first virtual object associated with the second network element, or combinations thereof.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein is a compact scalable 3D model generation apparatus, system, and method. A 3D model of a device, structure, and/or other object may be generated using a 3D mesh and a plurality of nested virtual objects. The 3D mesh may be generated to define the shape of a model, and may comprise a plurality of reference markers. A layer of 2D virtual objects may be associated to the reference markers of the 3D objects. The 2D virtual objects may also comprise reference markers, which may allow subsequent lower order layers of 2D virtual objects to be nested into the higher order 2D layers. A highly modular device may be generated at runtime using a single model and a minimal number of 2D virtual objects. The virtual objects in each layer may comprise properties which may be used to prevent combination of virtual objects in a manner that is unintended and/or unallowable by the system. The virtual objects may also be associated with actual objects on an actual device. Data associated with an actual object may be obtained by the system and used to modify an associated virtual object in real time. For example, a 3D model of a network device comprising a plurality of line cards each comprising a plurality of ports may be created using a 3D layer representing the network device, a 2D layer comprising a plurality of first order virtual objects representing line cards, and a plurality of lower order 2D virtual objects representing ports nested into the line card objects. If a port of the network device malfunctions, a property of an associated virtual port object and/or line card object may be changed to cause the port object on the 3D model to visually indicate the failure. Additionally or alternatively, an alternate virtual port object may be displayed to visually indicate a device status. Additional layers may be nested as needed to achieve greater granularity. The virtual objects may also be configured to respond to user input, such as a user mouse click, touch screen interaction, etc., which may allow the system to query the status of a particular object related to a virtual object on selection and display such data to the user resulting in a highly interactive 3D model.

Figure 1:
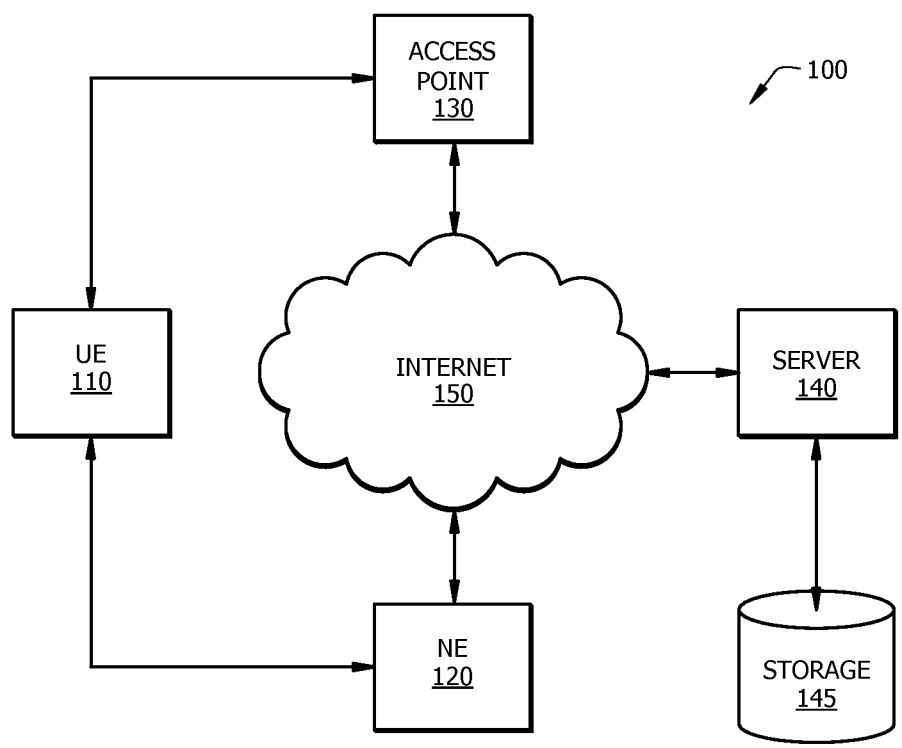
FIG. 1 is a schematic diagram of a network for supporting 3D model generation.

FIG. 1 is a schematic diagram of a network 100 for supporting 3D model generation. Network 100 may comprise a UE 110, a NE 120, a access point 130, a server 140, and a storage device 145, which may be interconnected via the Internet 150 as shown in FIG. 1. UE 110 may display a 3D model of NE 120 to a user. UE 110 may receive the data to generate the model of NE 120 from NE 120 and/or from storage 145 via access point 130. UE 110 may connect to NE 120 and/or server 140 via a wired and/or wireless interface with NE 120. In addition or in the alternative, UE 110 may connect to NE 120 and/or server 140 via a wireless interface with access point 130.

UE 110 may be any device configured to perform some or all of the methods described herein. For example, a UE 110 may be a cellular phone, a smart phone, tablet personal computer (PC), a laptop PC, a general purpose computer, a network terminal, or any other computing device capable of transmitting data over network 100 and displaying images to a user. As an example, a user may use UE 110 to generate and display a 3D model of NE 120. UE 110 may be configured to transmit and/or receive data over network 100 via wireless and/or wired communications protocols. As such, UE 110 may also receive network data indicating the status of NE 120 and/or the status of NE's 120 components and may modify the 3D model of NE 120 to display the network data to the user. As another example, a user may employ UE 110 to generate a model of an unrelated device, structure, or object. As another example, a user may employ UE 110 to manage NE 120 by interacting with a 3D model of NE 120.

Access point 130 may be any device configured to interface with UE 110 and Internet 150. In embodiments, access point 130 may be a base transceiver station, Evolved Universal Terrestrial Radio Access Network (E-UTRAN) node B (eNB), an Institute of Electrical and Electronics Engineers (IEEE) 802.11 (Wi-Fi) transceiver, or other wireless or wired access point. For example, access point 130 may be an eNB in a long term evolution (LTE) wireless communication system. UE 110 may communicate with access point 130 via wireless signals, and may connect to other components of network 100 via access point 130.

NE 120 may any network component configured to interface between UE 110 and Internet 150, such as an access point, router, switch, etc. NE 120 may comprise various hardware, software, and/or firmware components such as line cards, ports, links, processors, antennas, virtual machines, memory, and/or other components. Performance of NE's 120 components may be measured by various metrics, which may indicate when a component is congested, overloaded, malfunctioning, operating normally, etc. A 3D model of NE 120 may be used to represent the status and/or changes in status of NE 120 and/or NE 120 components.

Server 140 may be any device configured to manage NE 120 and/or maintain network data indicating the status of NE 120. For example, a server 140 may be an application server, communications server, a database server, a file server, a proxy server, a web server, or other server. Network data related to NE 120 may be stored by server 140 in a storage device 145. Storage device 145 may be positioned in the same network node as server 140 and/or may be located in a separate network node. UE 120 may communicate with NE 120 via server 140. Server 140 may be configured to transmit data to UE 110 in order to allow UE 110 to generate a 3D model of NE 120. In addition or in the alternative, server 140 may be configured to transmit data to UE 110 to allow UE 110 to generate other 3D models. In an embodiment, server 140 may also be configured to manage NE 120 based on requests from UE 110.

FIGS. 2A-D illustrate an embodiment of a 3D model 200. As an example, 3D model 200 may be generated to provide a graphical representation of a NE, such as NE 120. A 3D model may be generated by obtaining a 3D mesh that represents the 3D shape of the object. 2D virtual objects may be associated to the 3D mesh at reference points to represent the surface appearance of various portions of the object being modeled. Virtual objects may be positioned inside other virtual objects (e.g. nested) to further specify the surface appearance of the model. Multiple layers of virtual objects may be employed depending on the granularity needed to represent the object.

Figure 2A:
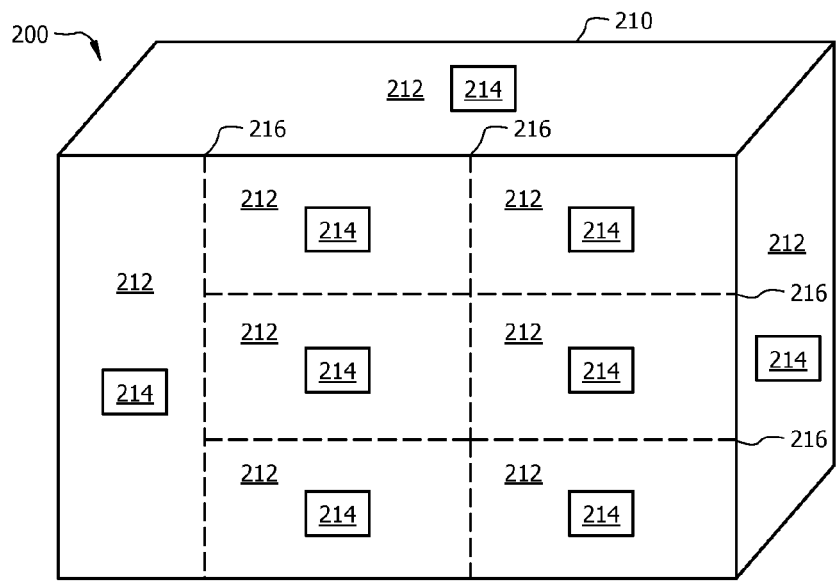
FIGS. 2A-D illustrate an embodiment of a 3D model.

Referring to FIG. 2A, a 3D model 200 may comprise a 3D mesh 210. A 3D mesh 210 may be a 3D representation of the shape of an object to be modeled. The 3D mesh 210 may comprise object areas 212, reference points 214, and boundaries 216. An object area 212 may be an area of the 3D mesh configured to receive a virtual object. Each object area 212 may comprise at least one reference point 214. A reference point 214 may be a point of association for a virtual object. For example, a virtual object may comprise dimensions that may be measured in relation to the reference point to which the virtual object is associated. If a 3D mesh is rotated and/or repositioned, the relationship between the virtual object and the reference point(s) may remain constant, which may result in the associated virtual object rotating and/or changing position with the 3D mesh 210. An object area 212 may comprise an aspect ratio. An aspect ratio may be a proportion between the object areas 212 width and height, which may remain constant even if the 3D mesh 210 changes size. A virtual object may inherit the aspect ratio of the object area 212 to which the virtual object is applied, which may allow the virtual object to be resized simultaneously with the 3D mesh 210.

An object area 212 may be bounded by boundaries 216, which may be employed for error checking. Boundaries 216 may be immutable or mutable. An immutable boundary 216 may not be crossed by a virtual object without resulting in an error. A mutable boundary 216 may be crossed by specific types of virtual objects. For example, a NE may comprise a plurality of line card bays, which may be represented by object areas 212 of model 200. A virtual object representing a line card designed to occupy two bays may be allowed to cross a mutable boundary 216, while a virtual object representing a line card designed to occupy a single bay may not be allowed to cross a mutable boundary 216. As a further example, an immutable boundary 216 may be employed to prevent either a two bay line card virtual object or single bay line card virtual object from extending beyond an object area 212, for example, to prevent the virtual object from extending outside of a configurable portion of the NE being modeled.

Figure 2B:
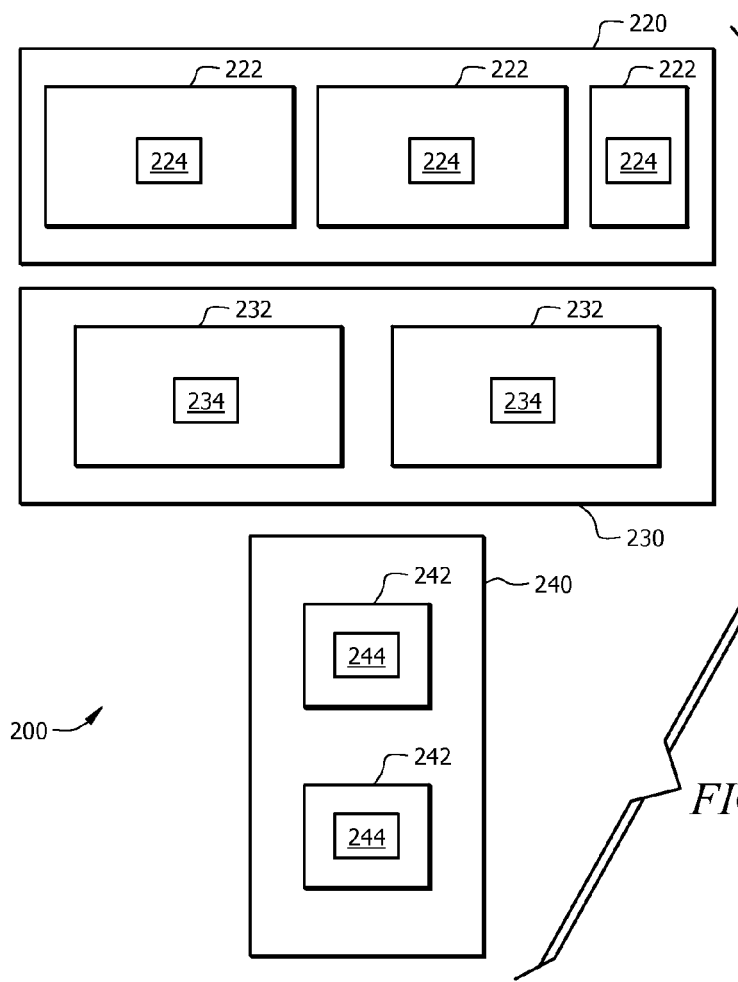

Referring to FIG. 2B, 3D model 200 may comprise a plurality of first order 2D virtual objects 220, 230, and 240, which may be used to represent the surfaces of an object being modeled. For example, virtual objects 220, 230, and 240 may represent various NE line cards, each comprising a plurality of available port configurations. Each virtual object 220, 230, and 240 may be associated with an object area 212 via a reference point 214. Multiple copies of virtual objects 220, 230, and 240 may be associated to different object areas 212. As discussed above, virtual objects 220, 230, and 240 may also cross mutable boundaries 216 in some cases. Each virtual object 220, 230, and 240, may comprise at least one reference point 224, 234, and 244, respectively. Reference points 224, 234, and 244 may function in a substantially similar manner to reference points 214, and may allow lower order virtual objects to be associated with higher order virtual objects. Virtual objects 220, 230, and 240 may also comprise a selectable area 222, 232, and 242, respectively. Selectable areas 222, 232, and 242 may be configured to respond to user input such as a selection from a user input device such as a mouse, trackball, touch-screen, etc. As selectable areas 222, 232, and 242 are specific to virtual objects 220, 230, 240, respectively, a user selection of a specific selectable area 222, 232, and 242 may be interpreted by the system as a request for information and/or action related to the object component modeled by the associated virtual object 220, 230, 240. A 2D virtual object may be a 2D object with only two dimensions or may be a thin 3D object. A thin 3D object may comprise a third dimension (e.g. depth) set to a negligible size (e.g. five pixels or less).

Figure 2C:
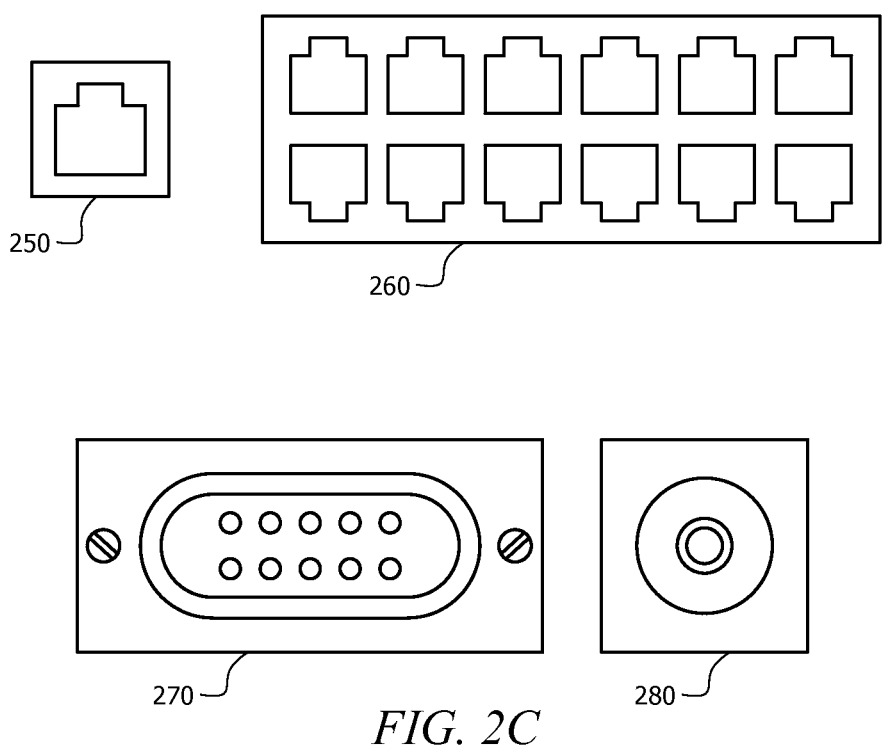

Referring to FIG. 2C, 3D model 200 may comprise a plurality of second order 2D virtual objects 250, 260, 270, and 280, which may be used to further specify the surfaces of an object being modeled. Virtual objects 250, 260, 270, and 280, may be associated with virtual objects 220, 230, and/or 240 via reference points 224, 234, and 244, respectively. For example, virtual objects 250, 260, 270, and 280 may represent specific port configurations available on various line cards. It should be noted that selectable areas similar to selectable areas 222, 232, and 242 may also be applied to virtual objects 250, 260, 270, and 280 for finer granularity of user interaction. It should also be noted that virtual objects are referred to herein in terms of higher order, lower order, first order, and/or second order. Such terms are used for purposes of clarity in order to distinguish between virtual object layers while describing the nesting features of the virtual objects discussed herein. Such terms should not be considered limiting. It should also be noted that while two layers of virtual objects are discussed, additional layers of virtual objects may be employed in order to reach the level of granularity sought for a particular application.

Figure 2D:
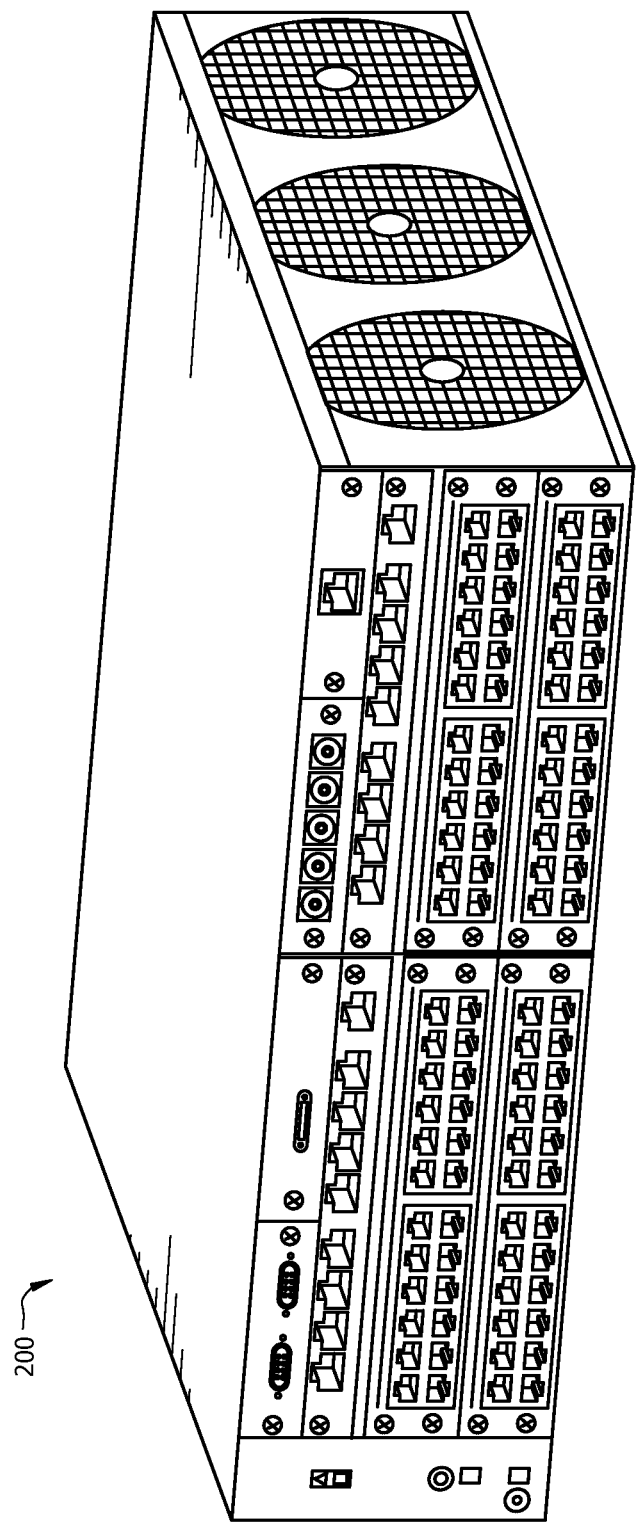

Referring to FIG. 2D, 3D model 200 may be generated by positioning virtual objects 220, 230, and/or 220 into 3D mesh 210 and by further positioning virtual objects 250, 260, 270, and/or 280 into virtual objects 220, 230, and/or 220, as discussed above. In this manner, a highly configurable highly modular device, such as a NE, may be modeled at run time by a single 3D mesh and a small number of reusable virtual objects, as opposed to requiring a distinct 3D model for each possible permutation of line cards and/or port configurations. Additionally, virtual objects may be changed at run time in response to changing network data. For example, a UE displaying a 3D model of a NE may receive network data that a particular port is malfunctioning. In that case, the UE may exchange a virtual object indicating a normal port with a virtual object indicating a malfunctioning port. For example, a malfunctioning port virtual object may comprise a color, for example red, overlaid onto the port image. In addition or in the alternative, a virtual object may comprise multiple color states which may be changed at run time in response to network data (e.g. red for malfunction, yellow for traffic congestion, green for operating, black for powered down, etc.) Also, the use of selectable areas may allow the user to graphically interact with an actual NE via the 3D model 200 of the NE to obtain real time network data.

It should be noted that a virtual object may comprise implementations other than a skin, which may result in significantly different model functionality. For example, a skin may always extend from boundary to boundary of a model as opposed to being associated with a reference marker. A skin may also extend between any boundaries and may inherit all shape characteristics from the model to which the skin is applied. As such, a skin may not be usable for configuration checking, may not be used to nest a first skin inside a second skin, and may not be selectable by a user.

Figure 3A:
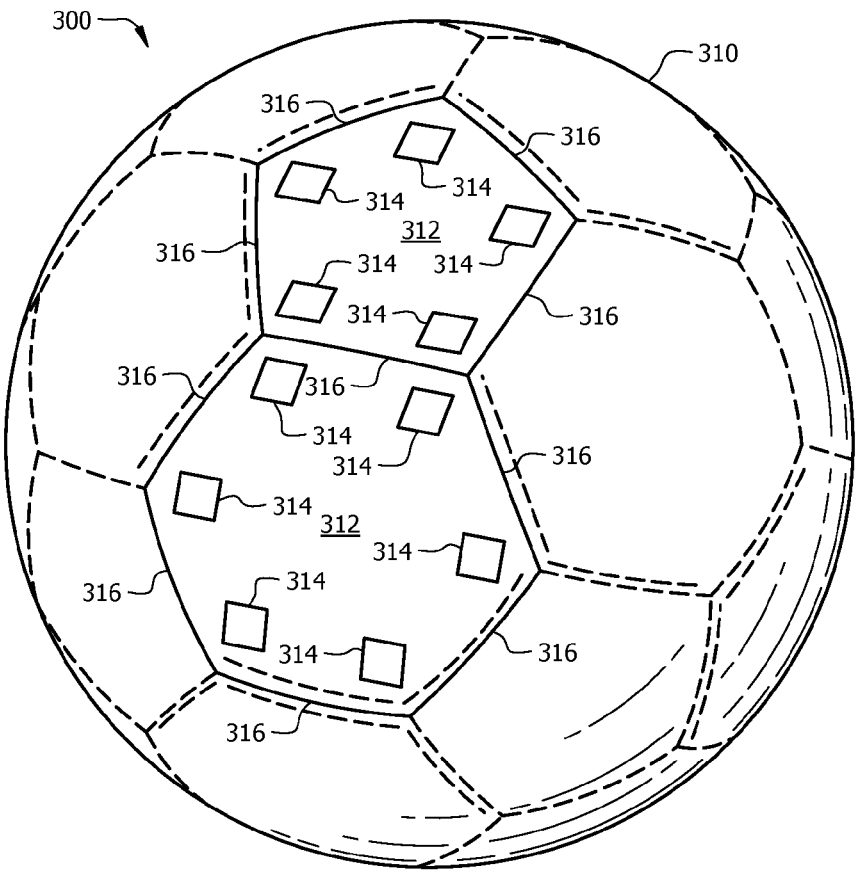
FIGS. 3A-C illustrate another embodiment of a 3D model.
Figure 3B:
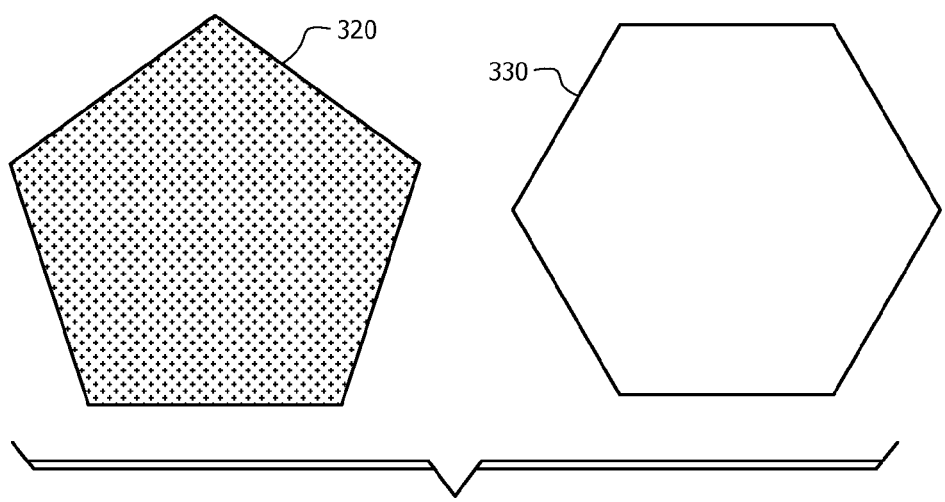
Figure 3C:
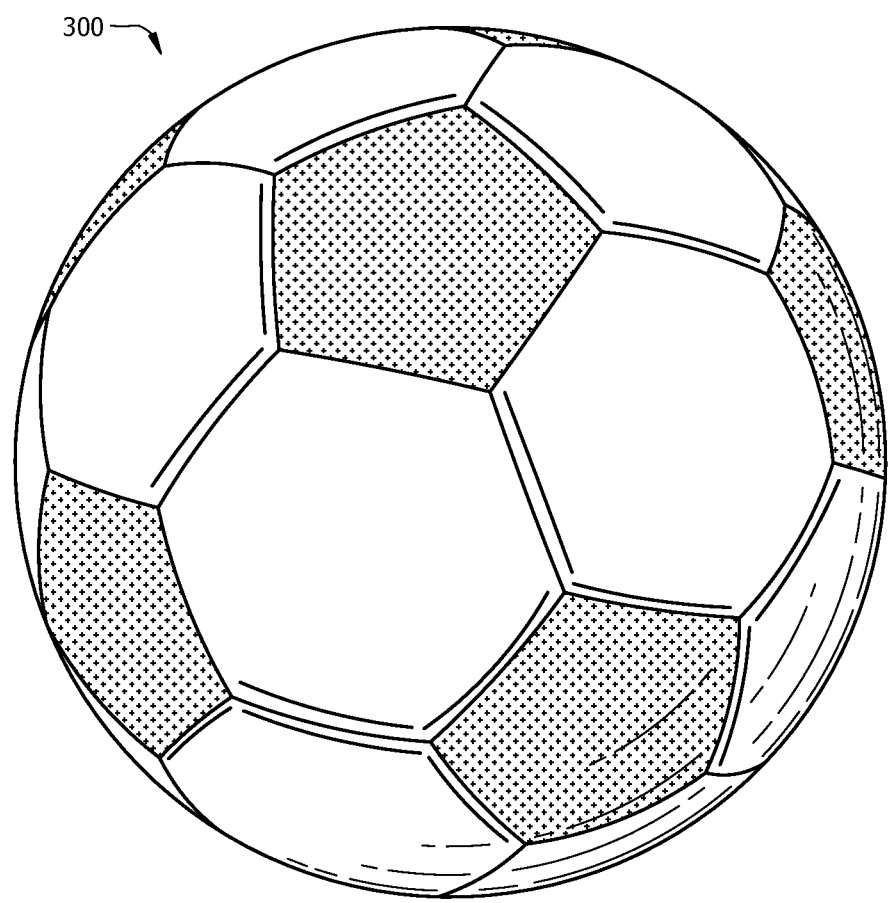

FIG. 3A-C illustrate another embodiment a 3D model 300. 3D model 300 may be a model of a soccer ball and is included to show that the techniques discussed herein may employed to model virtually any object, structure, device, and/or other thing, and is not limited to modeling NEs. 3D model 300 is also included to show that the techniques discussed herein may be employed to model objects with curved surfaces.

Referring to FIG. 3A, a 3D model 300 may comprise a 3D mesh 310 that may be similar to 3D mesh 210, but may represent a substantially spherical shape. 3D mesh 310 may comprise object areas 312, reference points 314, and boundaries 316, which may be similar to object areas 212, reference points 214, and boundaries 216. A plurality of reference points 214 may be used to orient virtual objects positioned in the in object areas 212.

Referring to FIG. 3B, a 3D model 300 may comprise virtual objects 320 and 330, which may be positioned in object areas 312. Virtual objects 320 and 330 may be similar to virtual objects 220, 230, and/or 240. Virtual objects 320 and/or 330 may be positioned in the object areas 312 and may be bent using appropriate algorithms to match the curvature and aspect ratio of the object area 312 to which the virtual object 320 and/or 330 is associated via reference points 314. Virtual object 320 may comprise five sides and virtual object 330 may comprise six sides. As such, some object areas 312 may comprise six boundaries while other object areas 312 may comprise five boundaries. Collision detection may be employed to prevent virtual object 320 from being positioned into six sided object area 312 and/or prevent virtual object 330 from being positioned into five sided object area. For example, positioning may be prevented if a portion of virtual object 320 and/or 330 would extend beyond a boundary 316. In addition or in the alternative, object areas 312 with five boundaries may comprise a preset property that only allows association of virtual object 320 and object areas 312 with six boundaries may comprise a preset property that only allows association of virtual object 330. Referring to FIG. 3C, a 3D model 300 may be generated by positioning virtual objects 320 and 330 into object areas 312 of virtual mesh 310.

Figure 4:
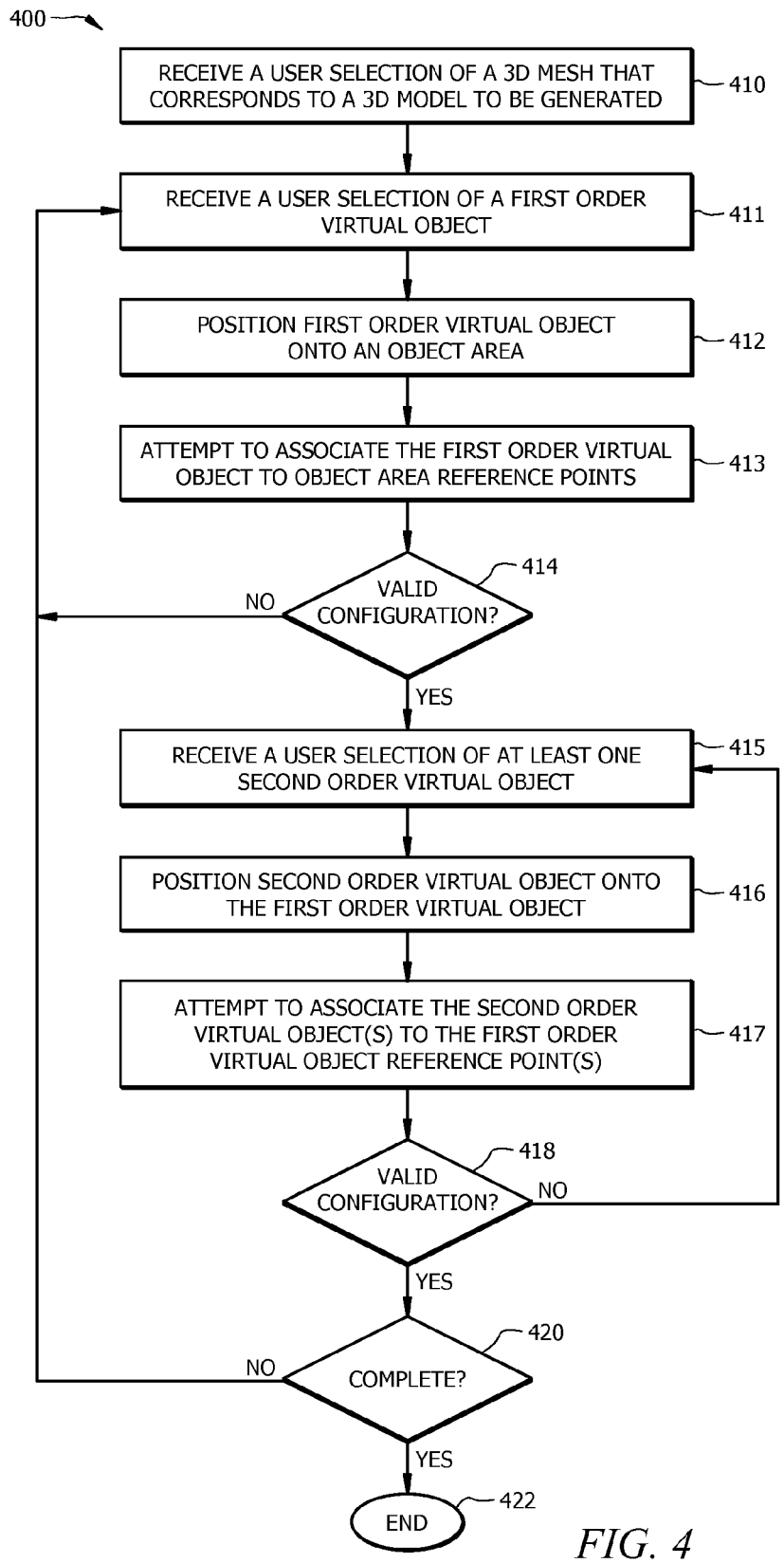
FIG. 4 is a flowchart of an embodiment of a method of generating a 3D model.

FIG. 4 is a flowchart of an embodiment of a method 400 of generating a 3D model. For example, a user wishing to purchase and/or construct a NE may employ a UE, such as UE 110, to implement method 400 to virtually build and view a model of the NE before the NE is purchased and/or actually constructed. In an embodiment, method 400 may be implemented on a server, such as server 140, and accessed via a UE (e.g. via a web page). At block 410, method 400 may receive a user selection of a 3D mesh that corresponds with the 3D model to be generated, such as 3D mesh 210 for model 200, and proceed to block 411. At block 411, method 400 may receive a user selection of a first order virtual object, such as virtual objects 220, 230, and/or 240, and proceed to block 412. At block 412, method 400 may position the first order virtual object onto an object area, such as object area 212 (e.g. based on user input), and proceed to block 413. At block 413, method 400 may attempt to associate the first order virtual object to the object area reference point(s), such as reference points 214. The method 400 may then proceed to block 414 and determine if the first order virtual object is in a valid configuration. For example, a configuration may be invalid if a virtual object will not fit in the object area. As another example, physical limitations of an NE being modeled may prevent a particular component from being positioned in a particular position (e.g. a first type of line card may not be positioned in the bay below a second type of line card, etc), and such limitations may be built into the 3D mesh and/or associated virtual objects to prevent the user from creating a model that would not function properly as a physical NE. The method 400 may proceed to block 415 if the configuration is valid or return to block 411 if the configuration is invalid. In an embodiment, the method 400 may also display an error message to the user if the configuration is determined to be invalid at block 414.

At block 415, method 400 may receive a user selection of at least one second order virtual object, such as virtual objects 250, 260, 270, and/or 280. At block 416, method 400 may position the second order virtual object onto the first order virtual object, such as virtual objects 220, 230, and/or 240 (e.g. based on user input), and proceed to block 417. At block 417, method 400 may attempt to associate the second order virtual object to the first order virtual object reference point(s), such as reference points 224, 234, and/or 244, respectively. The method 400 may then proceed to block 418 and determine if the configuration is valid in a similar manner to block 414. For example, a particular line card being modeled by a first order virtual object may not comprise a particular port for reasons related to the design of the line card. Such limitations may be built into the first order and/or second order virtual objects to prevent the user from creating a virtual object representing a line card that would not function properly as a physical line card. The method 400 may proceed to block 420 if the configuration is valid or return to block 415 if the configuration is invalid. In an embodiment, the method 400 may also display an error message to the user if the configuration is determined to be invalid at block 418.

If the configuration is valid, at block 420 the method 400 may determine if the 3D model is complete. If the model is complete, the method 400 may proceed to block 422 and end. If the model is not complete, method 400 may return to block 411 and receive a user selection of another first order virtual object. It should be noted that method 400 may be extended to allow for additional layers of virtual object nesting as needed for a given application.

Figure 5:
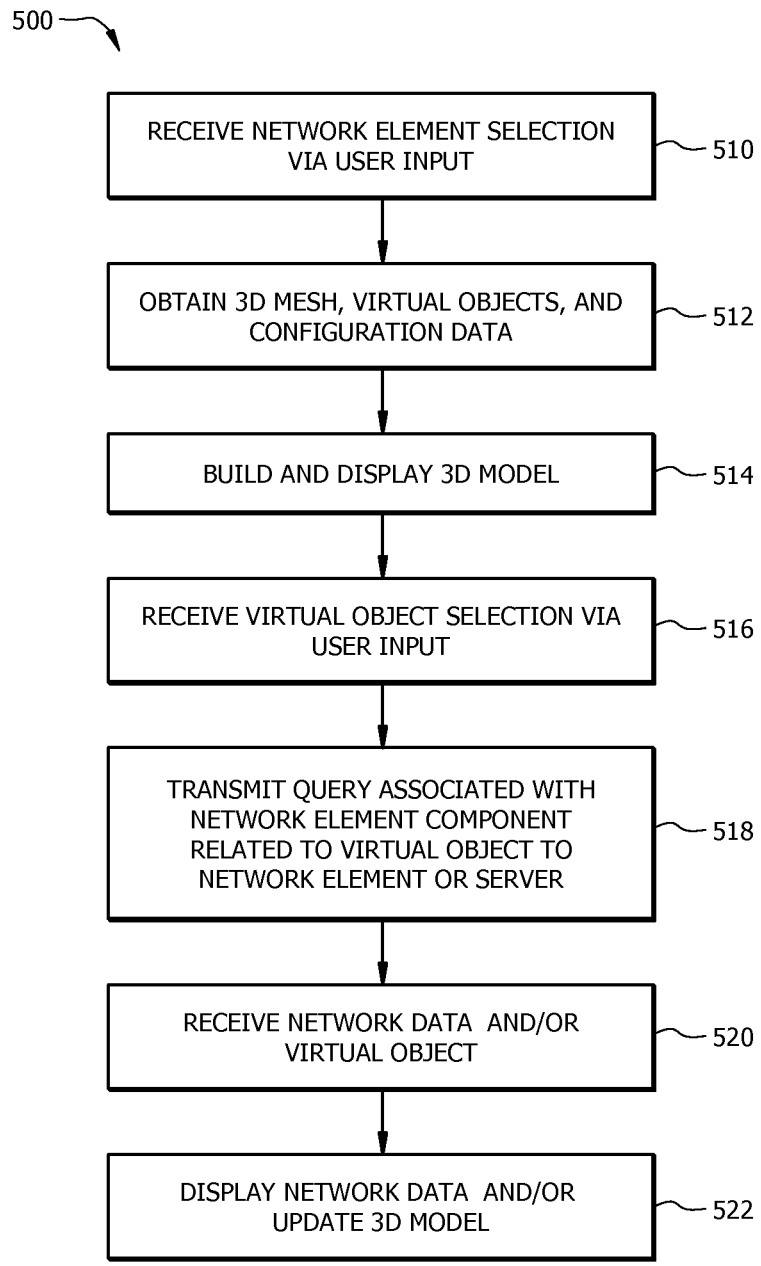
FIG. 5 is a flowchart of an embodiment of a method of displaying network data via a 3D model.

FIG. 5 is a flowchart of an embodiment of a method 500 of displaying network data via a 3D model. Method 500 may be implemented on a UE, such as UE 110, on a server, such as server 140, or combinations thereof. For example, the method 500 may be primarily implemented on the UE, and the UE may transmit requests to a server or NE to complete method 500. In another embodiment, the method 500 may be implemented on a server and accessed by the UE via a web page. Method 500 may allow a user to view the status of an existing NE that is operating in a network using a UE. At block 510, the method 500 may receive a NE selection from the user via a user input. For example, a user may select a particular NE by inputting and/or selecting an internet protocol (IP) address and/or selecting a visual representation of the NE from a network topology graph. The method 500 may proceed to block 512 and obtain a 3D mesh, virtual objects, and configuration data associated with the selected NE. Configuration data may be data that indicate the position of the virtual objects on the 3D mesh. At block 514, the method 500 may build the 3D model based on the 3D mesh (e.g. 3D mesh 210), virtual objects (e.g. virtual objects 220, 230, 240, 250, 260, and/or 280), and configuration data indicating the positions of the virtual objects on the 3D mesh as discussed above. The method may also display the 3D model to the user. The method 500 may also receive user input to rotate, resize, and or change position of the 3D model to view the model from different perspectives. Method 500 may make such changes to the model and display the changes.

In some instances, the user may wish to obtain specific information regarding a particular NE component. As such, method 500 may receive a virtual object selection via a user input at block 516. For example, the user may touch a UE touchscreen, which may be interpreted as a selection in a selectable area of a virtual object in the 3D model. At block 518, the method 500 may transmit a query associated with the NE component that is related to the selected virtual object via a network. The query may be transmitted directly to the NE or to a server, for example NE 120 or server 140, depending on the network configuration. At block 520, the method 500 may receive network data related to the component in a response message. The network data may comprise specific data regarding the NE component status, new configuration data, and/or a virtual object that represents a status (e.g. data indicating a port is malfunctioning, configuration data indicating a red port virtual object should be displayed, and/or a red port virtual object, respectively). At block 522, the method 500 may display the network data to the user and/or may update to the 3D model based on the received network data.

Figure 6:
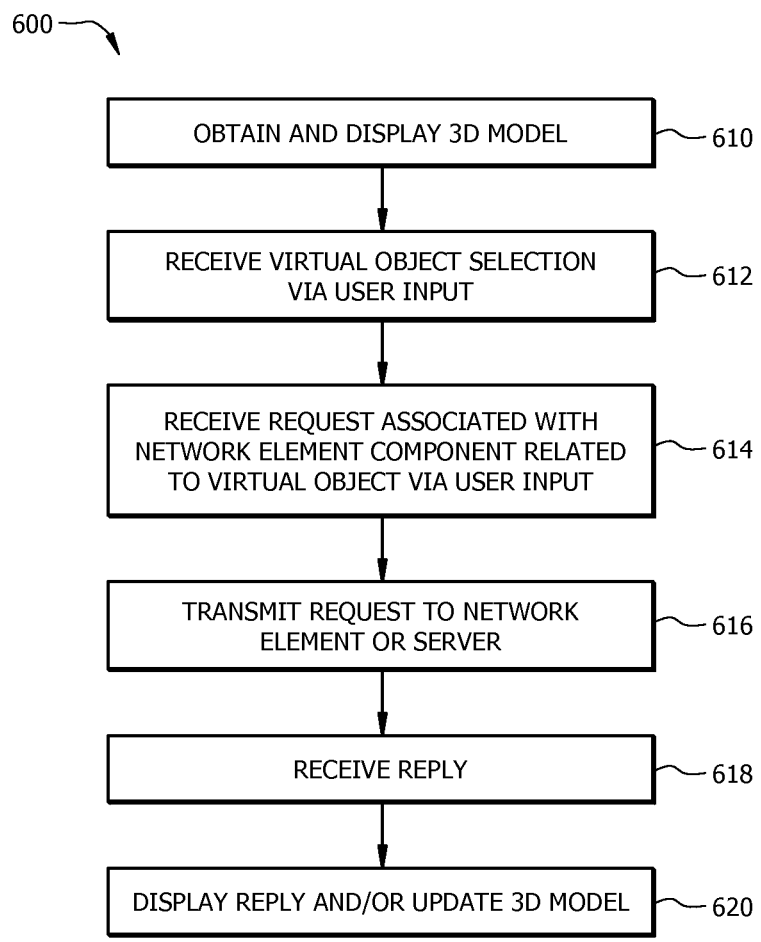
FIG. 6 is a flowchart of an embodiment of a method of managing a network element (NE) via a 3D model.

FIG. 6 is a flowchart of an embodiment of a method 600 of managing a NE via a 3D model. For example, a user may wish to transmit commands to a NE via a UE (e.g. UE 110) displaying a 3D model of the NE, and thus may implement method 600 on a UE. In another embodiment, method 600 may be implemented on a server, such as server 140, and a user may access the server via a UE (e.g. via a webpage). At block 610, the method 600 may obtain and display a 3D model of the NE, for example using block 510-514 of method 500. At block 612, the method 600 may receive a selection of a virtual object via user input, which may be similar to block 516. At block 614, the method 600 may receive a request from the user. The request may be associated with a NE component related to the virtual object selected by the user. For example, the user may indicate a desire to restart and/or change a setting of a selected component. At block 616, the method 600 may transmit the user's request directly to the NE or to a network management server for implementation. At block, 618 the method 600 may receive a reply from the network indicating the result of the request. At block 620, the method 600 may display the reply and/or update the 3D model to indicate the NE's current status.

Figure 7:
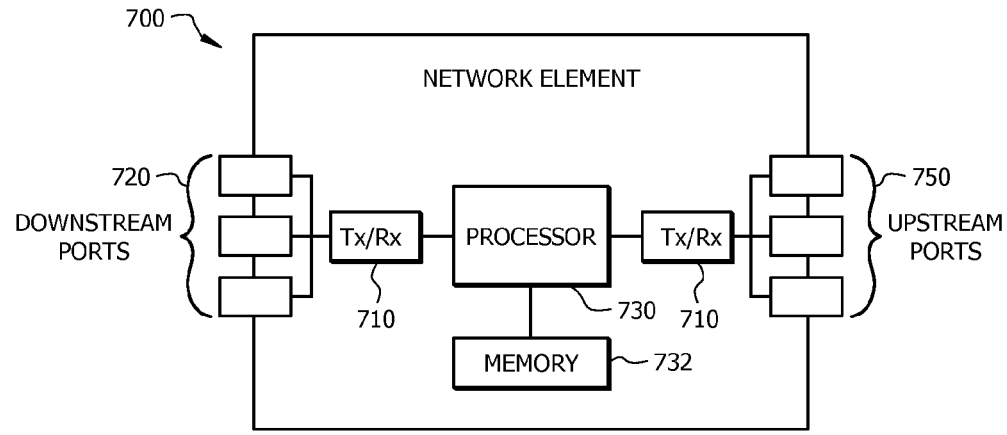
FIG. 7 is a schematic diagram of an embodiment of a NE.

FIG. 7 is a schematic diagram of an embodiment of a NE 700, which may function as a node in network 100; for example, NE 120, access point 130, and/or server 140. One skilled in the art will recognize that the term NE encompasses a broad range of devices of which NE 700 is merely an example. NE 700 is included for purposes of clarity of discussion, but is in no way meant to limit the application of the present disclosure to a particular NE embodiment or class of NE embodiments. At least some of the features/methods described in the disclosure, for example methods 400, 500, and/or 600, may be implemented whole or in part in a network apparatus or component such as a NE 700. For instance, the features/methods in the disclosure may be implemented using hardware, firmware, and/or software installed to run on hardware. The NE 700 may be any device that transports packets or frames through a network, e.g., a switch, router, bridge, server, etc. As shown in FIG. 7, the NE 700 may comprise transceivers (Tx/Rx) 710, which may be transmitters, a receiver, or combinations thereof. A Tx/Rx 710 may be coupled to plurality of downstream ports 720 for transmitting and/or receiving frames from other nodes, a Tx/Rx 710 coupled to plurality of upstream ports 750 for transmitting and/or receiving frames from other nodes, and a processor 730 coupled to the Tx/Rxs 710 to process the frames and/or determine which nodes to send frames to. Ports 720 and 750 may be bidirectional ports or may each comprise pairs of unidirectional ports. The processor 730 may comprise one or more multi-core processors and/or memory devices 732, which may function as data stores. The processor 730 may be implemented as one or more general purpose processors running software, one or more application specific integrated circuits (ASICs), and/or one or more digital signal processors (DSPs). The downstream ports 720 and/or upstream ports 750 may contain electrical and/or optical transmitting and/or receiving components. NE 700 may or may not be a routing component that makes routing decisions.

Figure 8:
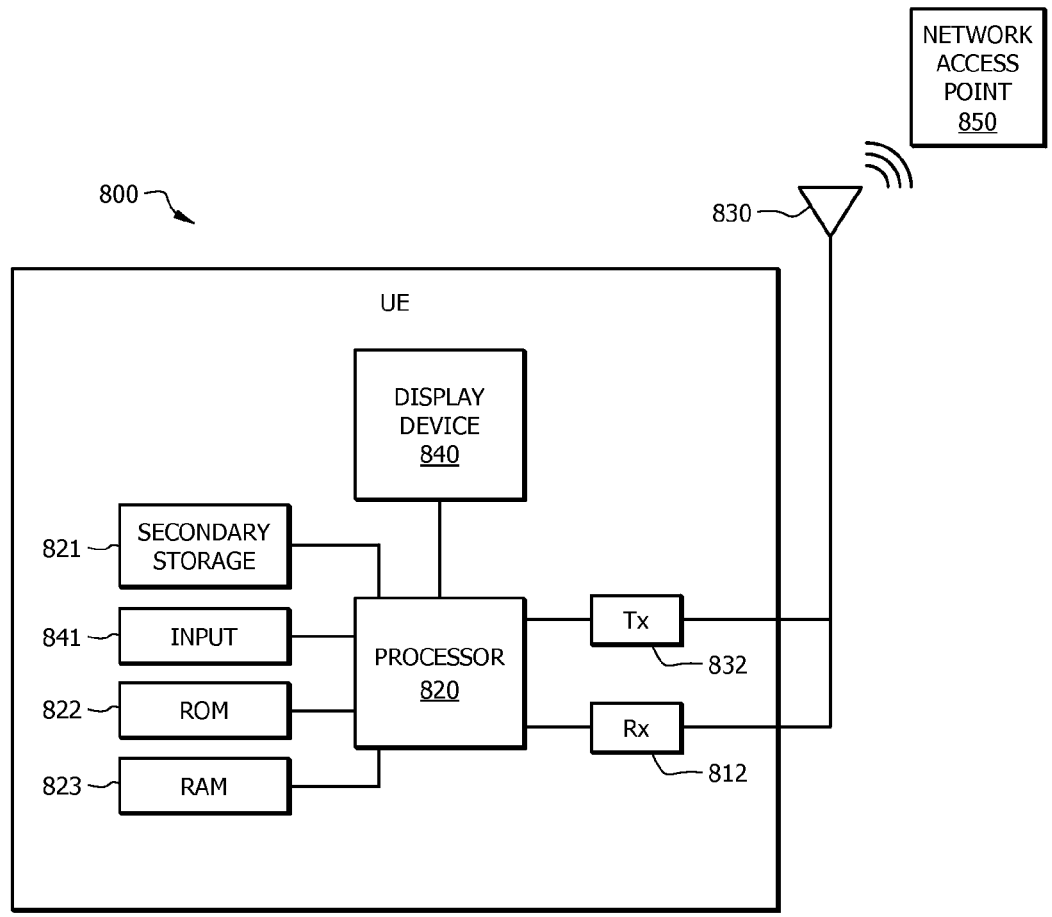
FIG. 8 a schematic diagram of an embodiment of UE.

FIG. 8 a schematic diagram of an embodiment of UE 800. UE 800 may comprise a two-way wireless communication device having voice and data communication capabilities. In some aspects, voice communication capabilities are optional. The UE 800 generally has the capability to communicate with other computer systems on the Internet. Depending on the exact functionality provided, the UE 800 may be referred to as a data messaging device, a two-way pager, a wireless e-mail device, a cellular telephone with data messaging capabilities, a wireless Internet appliance, a wireless device, a smart phone, a mobile device, and/or a data communication device, as examples.

UE 800 may comprise a processor 820 (which may be referred to as a central processor unit or CPU) that is in communication with memory devices including secondary storage 821, read only memory (ROM) 822, and random access memory (RAM) 823. The processor 820 may be implemented as one or more general purpose processors running software on one or more cores (e.g., a multi-core processor), or may be part of one or more ASICs and/or DSPs. The processor 820 may be configured to implement in whole or in part any of the schemes described herein, for example methods 400, 500, and/or 600, and may be implemented using hardware, software, firmware, or combinations thereof.

The secondary storage 821 may be comprised of one or more solid state drives, disk drives, and/or other memory types and is used for non-volatile storage of data and as an over-flow data storage device if RAM 823 is not large enough to hold all working data. Secondary storage 821 may be used to store programs that are loaded into RAM 823 when such programs are selected for execution. The ROM 822 may be used to store instructions and perhaps data that are read during program execution. ROM 822 may be a non-volatile memory device may have a small memory capacity relative to the larger memory capacity of secondary storage 821. The RAM 823 may be used to store volatile data and perhaps to store instructions. Access to both ROM 822 and RAM 823 may be faster than to secondary storage 821.

The UE 800 may communicate data (e.g., packets) wirelessly with a network via a network access point 850, which may be implemented as a NE 700. As such, the UE 800 may comprise a receiver (Rx) 812, which may be configured for receiving data (e.g. wireless packets or frames) from other components. The receiver 812 may be coupled to the processor 820, which may be configured to process the data and determine to which components the data is to be sent. The UE 800 may also comprise a transmitter (Tx) 832 coupled to the processor 820 and configured for transmitting data to other components, for example by using protocols such as Institute of Electrical and Electronics Engineers (IEEE) 802.11, IEEE 802.16, 3rd Generation Partnership Project (3GPP), Global System for Mobile Communications (GSM), or similar wireless protocols. The receiver 812 and transmitter 1032 may be coupled to a plurality of antennas 830, which may be configured to receive and transmit wireless radio frequency (RF) signals. In some embodiments, Tx 832 and Rx 812 may be replaced by a transceiver comprising the functionality of both Tx 832 and Rx 812.

The UE 800 may also comprise a device display 840 coupled to the processor 820, that displays output thereof to a user. The UE 800 and the device display 840 may be configured to display representations of data to a user. The device display 820 may comprise a Color Super Twisted Nematic (CSTN) display, a thin film transistor (TFT) display, a thin film diode (TFD) display, an organic light-emitting diode (OLED) display, an active-matrix OLED display, or any other display screen. The device display 840 may display in color or monochrome and may be equipped with a touch sensor based on resistive and/or capacitive technologies.

The UE 800 may further comprise an input device 841 coupled to the processor 820, which may allow the user to input commands to the UE 800. In the case that the display device 840 comprises a touch sensor, the display device 840 may also be considered the input device 841. In addition to and/or in the alternative, an input device 841 may comprise a mouse, trackball, built-in keyboard, external keyboard, and/or any other device that a user may employ to interact with the UE 800.

It is understood that by programming and/or loading executable instructions onto the NE 700, at least one of the processor 730, memory 732, Tx/Rx 710, are changed, transforming the NE 700 in part into a particular machine or apparatus, e.g., a multi-core forwarding architecture, having the novel functionality taught by the present disclosure. Similarly, it is understood that by programming and/or loading executable instructions onto the UE 800, at least one of the processor 802, the ROM 822, the RAM 823, secondary storage 821, transmitter 832, and/or receiver 812 are changed, transforming the UE 800 in part into a particular machine or apparatus, e.g., a multi-core forwarding architecture, having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an ASIC, because for large production runs the hardware implementation may be less expensive than the software implementation. Often a design may be developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 7 percent, . . . , 70 percent, 71 percent, 72 percent, . . . , 97 percent, 96 percent, 97 percent, 98 percent, 99 percent, or 100 percent. Moreover, any numerical range defined by two R numbers as defined in the above is also specifically disclosed. The use of the term "about" means±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A method of generating a three dimensional (3D) graphical model comprising:
    obtaining a 3D mesh comprising a 3D mesh reference marker, wherein the 3D mesh defines a 3D shape of the 3D graphical model;
    obtaining a first order virtual object that defines a surface appearance of a component of the 3D graphical model;
    positioning the first order virtual object onto a surface of the 3D mesh by associating the first order virtual object to the 3D mesh reference marker, wherein the first order virtual object comprises a first order reference marker, wherein the surface of the 3D mesh comprises a mutable boundary, and wherein the first order virtual object is extended across the mutable boundary only when positioning the first order virtual object across the mutable boundary results in a valid configuration;
    obtaining a second order virtual object that defines a surface appearance of a sub-component of the component;
    determining whether positioning the second order virtual object onto the first order virtual object would result in an invalid component combination;
    iteratively obtaining a new second order virtual object that is different from a previous second order virtual object when the positioning the second order virtual object onto the first order virtual objects results in the invalid component combination;
    positioning the new second order virtual object onto the first order virtual object until a valid component combination is obtained when the positioning the second order virtual object onto the first order virtual object results in the invalid component combination;
    positioning the second order virtual object into the first order virtual object by associating the second order virtual object to the first order reference marker; and
    generating a 3D model, wherein the 3D model includes at least the 3D mesh and valid positions of both the first order virtual object and the second order virtual object.

2. The method of claim 1, wherein the second order virtual object is selected from a group of virtual objects prior to positioning the second order virtual object onto the first order virtual object.

3. The method of claim 1, wherein the second order virtual object comprises a selectable area, and wherein the method further comprises transmitting a request related to the second order virtual object when a user selects the selectable area of the second order virtual object with an input device.

4. The method of claim 1, wherein the 3D graphical model models a physical device, wherein the first order virtual object and the second order virtual object model a component of the physical device, and wherein the method further comprises:
   receiving data indicating a status of the physical device component; and
   modifying an appearance of the first order virtual object or the second order virtual object based on the received data.

5. The method of claim 1, wherein the 3D mesh comprises an object area that comprises the 3D mesh reference marker, wherein the object area comprises an aspect ratio, and wherein positioning the first order virtual object onto the 3D mesh comprises setting an aspect ratio of the first order virtual object equal to the aspect ratio of the object area.

6. A user equipment (UE) comprising:
   a receiver configured to receive a status of a physical device component; and
   a processor coupled to the receiver and configured to generate a three dimensional (3D) model of the physical device component by:
      obtaining a 3D mesh comprising a plurality of 3D mesh reference markers;
      positioning at least one first order virtual object onto a surface of the 3D mesh by associating the first order virtual object to at least one of the 3D mesh reference markers, wherein the first order virtual object comprises a plurality of first order virtual object reference markers, wherein the surface of the 3D mesh comprises a mutable boundary, and wherein the first order virtual object is extended across the mutable boundary only when positioning the first order virtual object across the mutable boundary results in a valid configuration;
      positioning at least one second order virtual object onto the surface of the 3D mesh by associating the second order virtual object to at least one of the first order virtual object reference markers, wherein the first order virtual object and the second order virtual object model the physical device component;
      iteratively obtaining a new second order virtual object that is different from a previous second order virtual object;
      positioning the new second order virtual object onto the first order virtual object until a valid component combination is obtained;
      modifying an appearance of the first order virtual object or the second order virtual object to indicate the received status of the physical device component to a user via a display; and
      generating a 3D model of the physical device component, wherein the 3D model of the physical device component includes at least a 3D mesh and valid positions of both the first order virtual object and the second order virtual object.

7. The UE of claim 6, wherein the processor is further configured to modify a view of the 3D model based on user input by rotating the 3D mesh, changing a size of the 3D mesh, repositioning the 3D mesh, or combinations thereof.

8. The UE of claim 6, wherein the first order virtual object and the second order virtual object are positioned based on user input.

9. The UE of claim 6, wherein the processor is further configured to generate an error when associating the second order virtual object with the first order virtual object would result in an invalid component combination.

10. The UE of claim 6, wherein the first order virtual object or the second order virtual object is designated as a selectable virtual object, and wherein the processor is further configured to perform an action in response to user input indicating a selection of the selectable virtual object.

11. The UE of claim 10, wherein the UE further comprises a transmitter coupled to the processor, and wherein the action comprises transmitting, via the transmitter, a message to a physical device comprising the physical device component over a network connection.

12. The UE of claim 10, wherein the UE further comprises a transmitter coupled to the processor, and wherein the action comprises transmitting, via the transmitter, a message to a network server via a network connection, wherein the network server maintains data related to a physical device comprising the physical device component.

13. The UE of claim 6, wherein the first order virtual object and the second order virtual object comprise two dimensions.

14. The UE of claim 6, wherein the first order virtual object and the second order virtual object are 3D objects with at least one dimension set to a negligible size.

15. A network element comprising:
   a transmitter;
   a receiver;
   a processor coupled to the transmitter and the receiver; and
   a memory coupled to the processor and comprising instructions, wherein the instructions cause the processor to:
      store a three dimensional (3D) model, in the memory, as a 3D mesh comprising a plurality of 3D mesh reference markers and a plurality of virtual objects configured to be positioned on a surface of the 3D mesh via at least one of the 3D mesh reference markers;
      receive, via the receiver, a request message from a user equipment (UE) for a 3D model data related to a physical network device;
      transmit, via the transmitter, a reply message, wherein the reply message comprises the 3D mesh, configuration data associated with the physical network device, and a first virtual object associated with a component of the physical network device;
      iteratively obtain a second order virtual object;
      position the second order virtual object onto the first order virtual object until valid component combination is obtained; and
      generate a 3D model of the physical network device, wherein the 3D model of the physical network device includes at least the 3D mesh and valid positions of both the first order virtual object and the second order virtual object,
   wherein an appearance of the first virtual object indicates a status of the component of the physical network device to a user of the UE,
   wherein the configuration data indicates a position of the first virtual object on a surface of the 3D mesh,
   wherein the surface of the 3D mesh comprises a mutable boundary, and wherein the first virtual object is extended across the mutable boundary only when positioning the first virtual object across the mutable boundary results in a valid configuration.

16. The network element of claim 15, wherein the first virtual object is selected from the plurality of virtual objects based on the status of the component of the physical network device.

17. The network element of claim 15, wherein the processor is further configured to transmit, via the transmitter, a request message to the physical network device based on the request message from the UE.

18. The network element of claim 15, wherein the 3D model is generated based on user input received via the UE, and wherein the instructions further cause the processor to transmit, via the transmitter, an error message to the UE when the virtual objects are arranged in an invalid component combination for modeling the component of the physical network device.

* * * * *

UNITED STATES PATENT AND TRADEMARK OFFICE
CERTIFICATE OF CORRECTION

| | | |
|---|---|---|
| PATENT NO. | : 9,508,196 B2 | Page 1 of 3 |
| APPLICATION NO. | : 13/678065 | |
| DATED | : November 29, 2016 | |
| INVENTOR(S) | : Yunxia Chen et al. | |

It is certified that error appears in the above-identified patent and that said Letters Patent is hereby corrected as shown below:

In the Claims

Column 12, Lines 24-61, Claim 1, should read:
1. A method of generating a three dimensional (3D) graphical model comprising:
    obtaining a 3D mesh comprising a 3D mesh reference marker, wherein the 3D mesh defines a 3D shape of the 3D graphical model;
    obtaining a first order virtual object that defines a surface appearance of a component of the 3D graphical model;
    positioning the first order virtual object onto a surface of the 3D mesh by associating the first order virtual object to the 3D mesh reference marker, wherein the first order virtual object comprises a first order reference marker, wherein the surface of the 3D mesh comprises a mutable boundary, and wherein the first order virtual object is extended across the mutable boundary only when positioning the first order virtual object across the mutable boundary results in a valid configuration;
    obtaining a second order virtual object that defines a surface appearance of a sub-component of the component;
    determining whether positioning the second order virtual object onto the first order virtual object would result in an invalid component combination;
    iteratively obtaining a new second order virtual object that is different from a previous second order virtual object when the positioning the second order virtual object onto the first order virtual object results in the invalid component combination;
    positioning the new second order virtual object onto the first order virtual object until a valid component combination is obtained when the positioning the second order virtual object onto the first order virtual object results in the invalid component combination;
    positioning the second order virtual object into the first order virtual object by associating the second order virtual object to the first order reference marker; and
    generating a 3D model, wherein the 3D model includes at least the 3D mesh and valid positions of both the first order virtual object and the second order virtual object.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,508,196 B2

Column 13, Lines 21-60, Claim 6, should read:
6. A user equipment (UE) comprising:
    a receiver configured to receive a status of a physical device component; and
    a processor coupled to the receiver and configured to generate a three dimensional (3D) model of the physical device component by:
        obtaining a 3D mesh comprising a plurality of 3D mesh reference markers;
        positioning at least one first order virtual object onto a surface of the 3D mesh by associating the first order virtual object to at least one of the 3D mesh reference markers, wherein the first order virtual object comprises a plurality of first order virtual object reference markers, wherein the surface of the 3D mesh comprises a mutable boundary, and wherein the first order virtual object is extended across the mutable boundary only when positioning the first order virtual object across the mutable boundary results in a valid configuration;
        positioning at least one second order virtual object onto the surface of the 3D mesh by associating the second order virtual object to at least one of the first order virtual object reference markers, wherein the first order virtual object and the second order virtual object model the physical device component;
        iteratively obtaining a new second order virtual object that is different from a previous second order virtual object;
        positioning the new second order virtual object onto the first order virtual object until a valid component combination is obtained;
        modifying an appearance of the first order virtual object or the second order virtual object to indicate the received status of the physical device component to a user via a display; and
        generating a 3D model of the physical device component, wherein the 3D model of the physical device component includes at least the 3D mesh and valid positions of both the first order virtual object and the second order virtual object.

Column 14, Lines 28-66, through Column 15, Lines 1-4, Claim 15, should read:
15. A network element comprising:
    a transmitter;
    a receiver;
    a processor coupled to the transmitter and the receiver; and
    a memory coupled to the processor and comprising instructions, wherein the instructions cause the processor to:
        store a three dimensional (3D) model, in the memory, as a 3D mesh comprising a plurality of 3D mesh reference markers and a plurality of virtual objects configured to be positioned on a surface of the 3D mesh via at least one of the 3D mesh reference markers;
        receive, via the receiver, a request message from a user equipment (UE) for a 3D model data related to a physical network device;
        transmit, via the transmitter, a reply message, wherein the reply message comprises the 3D mesh, configuration data associated with the physical network device, and a first virtual object associated with a component of the physical network device;
        iteratively obtain a second order virtual object, position the second order virtual object onto the first order virtual object until a valid component combination is obtained; and generate a 3D model of the physical network device, wherein the 3D model of the physical network device includes at least the 3D mesh and valid positions of both the first order virtual object and the second order virtual object, wherein an appearance of the first virtual object indicates a status of the component of the physical network device to a user of the UE, wherein the configuration data indicates a position of the first virtual object on a surface of the 3D mesh, wherein the surface of the 3D mesh comprises a mutable boundary, and wherein the first virtual object is extended across the mutable boundary only when positioning the first virtual object across the mutable boundary results in a valid configuration.